United States Patent
Chiu et al.

(10) Patent No.: US 10,607,848 B2
(45) Date of Patent: Mar. 31, 2020

(54) METHOD OF FABRICATING SEMICONDUCTOR DEVICE

(71) Applicant: MACRONIX International Co., Ltd., Hsinchu (TW)

(72) Inventors: Yuan-Chieh Chiu, Hsinchu (TW); Shih-Ping Hong, Hsinchu (TW); Kuang-Chao Chen, Hsinchu (TW); Yen-Ju Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/955,549

(22) Filed: Apr. 17, 2018

(65) Prior Publication Data

US 2018/0233375 A1 Aug. 16, 2018

Related U.S. Application Data

(62) Division of application No. 14/707,648, filed on May 8, 2015, now Pat. No. 9,953,841.

(51) Int. Cl.
*H01L 21/311* (2006.01)
*H01L 23/485* (2006.01)
(Continued)

(52) U.S. Cl.
CPC .... *H01L 21/31111* (2013.01); *H01L 21/3105* (2013.01); *H01L 21/76826* (2013.01); *H01L 21/76831* (2013.01); *H01L 23/485* (2013.01); *H01L 23/5226* (2013.01); *H01L 21/28247* (2013.01); *H01L 21/28255* (2013.01); *H01L 21/28264* (2013.01); *H01L 23/3171* (2013.01);
(Continued)

(58) Field of Classification Search
CPC ........ H01L 21/76801; H01L 21/76829; H01L 21/76832; H01L 21/76897; H01L 21/76814; H01L 21/76822; H01L 21/76826; H01L 21/76841; H01L 21/76483; H01L 21/76844; H01L 21/76846; H01L 21/76856
See application file for complete search history.

(56) References Cited

U.S. PATENT DOCUMENTS

| 7,088,003 B2* | 8/2006 | Gates | H01L 21/76801 174/257 |
| 7,212,160 B2* | 5/2007 | Bertoni | G01S 5/02 342/453 |
| 7,335,980 B2* | 2/2008 | Nguyen | H01L 21/02126 216/41 |
| 7,579,277 B2* | 8/2009 | Owada | H01L 21/02126 257/753 |

(Continued)

FOREIGN PATENT DOCUMENTS

JP H04356944 12/1992

*Primary Examiner* — David A Zarneke
(74) *Attorney, Agent, or Firm* — J.C. Patents

(57) ABSTRACT

Provided is a method of fabricating a semiconductor device including the following steps. A substrate is provided. A material layer having an opening is formed on the substrate. A first passivation material layer is formed on sidewalls of the opening and on the substrate. A treatment process is performed to the first passivation material layer to form a second passivation material layer. A first surface of the second passivation material layer and a second surface (at an inner side) of the second passivation material layer are differ in a property, and the first surface is located at a side of the second passivation material layer relatively away from the material layer.

14 Claims, 4 Drawing Sheets

(51) Int. Cl.
  *H01L 23/522* (2006.01)
  *H01L 21/768* (2006.01)
  *H01L 21/3105* (2006.01)
  *H01L 23/532* (2006.01)
  *H01L 23/31* (2006.01)
  *H01L 21/28* (2006.01)
  *H01L 33/44* (2010.01)
  *H01L 31/18* (2006.01)

(52) U.S. Cl.
  CPC ...... *H01L 23/3178* (2013.01); *H01L 23/3185* (2013.01); *H01L 23/5329* (2013.01); *H01L 23/53223* (2013.01); *H01L 23/53238* (2013.01); *H01L 23/53266* (2013.01); *H01L 31/1868* (2013.01); *H01L 33/44* (2013.01)

(56) References Cited

U.S. PATENT DOCUMENTS

| | | | | |
|---|---|---|---|---|
| 8,615,661 | B2* | 12/2013 | Little | H04L 51/063 |
| | | | | 713/182 |
| 8,980,715 | B2* | 3/2015 | Grill | H01L 21/76283 |
| | | | | 257/411 |
| 9,234,276 | B2* | 1/2016 | Varadarajan | C23C 16/325 |
| 9,349,691 | B2* | 5/2016 | Murray | H01L 23/53295 |
| 9,431,235 | B1* | 8/2016 | Nguyen | H01L 21/02126 |
| 10,181,443 | B2* | 1/2019 | Liou | H01L 23/53295 |
| 10,297,442 | B2* | 5/2019 | Varadarajan | H01L 21/02211 |
| 2001/0001503 | A1* | 5/2001 | Guo | H01L 21/28518 |
| | | | | 257/622 |
| 2014/0217589 | A1* | 8/2014 | Liou | H01L 21/76841 |
| | | | | 257/751 |

* cited by examiner

METHOD OF FABRICATING SEMICONDUCTOR DEVICE

CROSS-REFERENCE TO RELATED APPLICATION

This application is a divisional application of and claims the priority benefit of U.S. application Ser. No. 14/707,648, filed on May 8, 2015, now allowed. The entirety of the above-mentioned patent application is hereby incorporated by reference herein and made a part of this specification.

BACKGROUND OF THE INVENTION

1. Field of the Invention

The invention relates to a method of fabricating a semiconductor device.

2. Description of Related Art

As semiconductor devices are integrated, in order to achieve high density and high performance, it is preferred to form a structure stacked upward when fabricating the semiconductor devices, such that the wafer area can be used more efficiently. Thus, semiconductor structures or openings having a high aspect ratio are commonly found in small-sized devices.

When manufacturing these devices, to prevent a leakage current from being generated form the sidewall of contact, it is common to form a passivation layer on the sidewall of the opening (contact hole). However, the reaction gas used for forming the passivation layer may form condensation in the opening after formation of the passivation layer. If the condensation is not completely removed and remains at the bottom part of the opening, a condensation defect may occur and hinder the subsequent etching process. Consequently, the passivation layer at the bottom part of the opening cannot be removed completely, which causes blind holes or reduces the yield rate. Thus, for the semiconductor structures having a high aspect ratio, how to form the passivation layer on the sidewall of the opening and avoid residual passivation layer on the surface of the bottom part of the opening is certainly an issue to work on.

SUMMARY OF THE INVENTION

The invention provides a method of fabricating a semiconductor device for effectively forming a passivation layer on a sidewall of an opening of a semiconductor structure having a high aspect ratio while preventing a residue of the passivation layer on a surface of a bottom part of the opening.

The invention provides a method of fabricating a semiconductor device. The method of fabricating the semiconductor device includes following steps. A substrate is provided. A material layer is formed on the substrate, and the material layer has an opening. A first passivation material layer is formed on sidewall of the opening and on the substrate. A treatment process is performed to the first passivation material layer to form a second passivation material layer. In addition, a first surface of the second passivation material layer and a second surface of the second passivation material layer differ in a property, and the first surface is located at a side of the second passivation material layer relatively away from the material layer.

According to an embodiment of the invention, the second passivation layer is a composite layer, and the composite layer includes a first layer and a second layer. The first layer is located on a sidewall of the opening of the material layer, and the second layer is located on the first layer. In addition, a thickness of the first layer is the same as a thickness of the second layer.

According to an embodiment of the invention, the second passivation layer is a composite layer, and the composite layer includes a first layer and a second layer. The first layer is located on a sidewall of the opening of the material layer, and the second layer is located on the first layer. In addition, a thickness of the first layer is different from a thickness of the second layer.

According to an embodiment of the invention, the second passivation material layer is a composite layer, and the composite layer includes a first layer disposed on the sidewall of the opening and a second layer disposed on the first layer. A hydrophobicity of the second layer is greater than a hydrophobicity of the first layer.

According to an embodiment of the invention, a content of oxygen of the second layer is greater than a content of oxygen of the first layer.

According to an embodiment of the invention, the second passivation material layer is a single layer, and a hydrophobicity of the single layer gradually increases from the sidewall of the opening to the first surface of the second passivation material layer.

According to an embodiment of the invention, the passivation layer is a single layer, and a content of oxygen of the single layer gradually increases from the sidewall of the opening of the material layer to the first surface of the second passivation material layer.

According to an embodiment of the invention, the method of fabricating the semiconductor device further includes: performing an etching process to remove the second passivation material layer on a bottom part of the opening and on a top part of the material layer and form a passivation layer.

According to an embodiment of the invention, the method of fabricating the semiconductor device further includes: after performing the etching process, forming a barrier layer on the passivation layer and the substrate. A material of the barrier layer includes titanium, titanium nitride, tantalum, tantalum nitride, or a combination thereof.

According to an embodiment of the invention, a material of the second passivation material layer includes silicon nitride, silicon oxynitride, or a combination thereof.

According to an embodiment of the invention, the material of the second passivation material layer further includes silicon-rich silicon dioxide, boron-doped silicon dioxide, phosphorus-doped silicon dioxide, silicon oxycarbide, silicon hydroxide, silicon oxycarbonitride, or a combination thereof.

According to the above, in the invention, by performing the treatment process to the passivation material layer and making the treated first surface (located at the side of the passivation material layer relatively away from the material layer) of the passivation material layer and the second surface (the inner side) differ in a property, the passivation layer is effectively formed on the sidewall of the opening of the semiconductor structure having a high aspect ratio and a residue of the passivation layer at the bottom part of the opening is prevented, thereby eliminating the leakage current generated form the sidewall of contact and thus improving the electrical performance of the semiconductor device.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
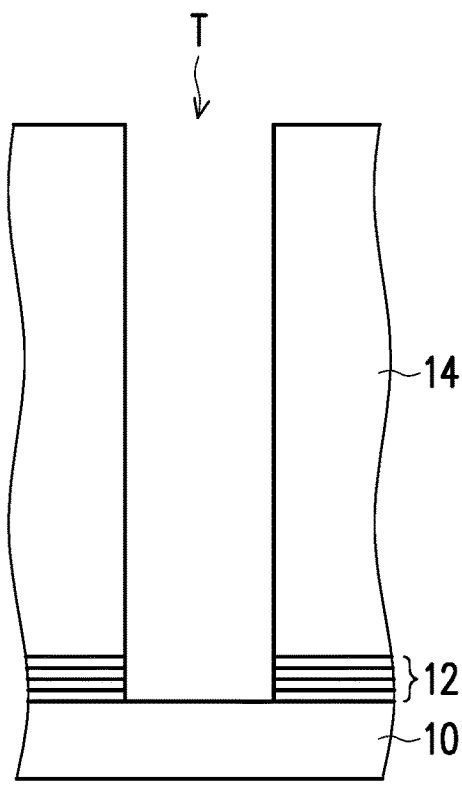
FIGS. 1A to 1E are cross-sectional schematic views illustrating a method of fabricating a semiconductor device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1E are cross-sectional schematic views illustrating a method of fabricating a semiconductor device according to an embodiment of the invention.

First, as shown in FIG. 1A, a substrate 10 is provided. The substrate 10 may include a semiconductor material, an insulator material, a conductor material, or a combination thereof. A material of the substrate 10 is a material formed of at least one substance selected from a group consisting Si, Ge, SiGe, GaP, GaAs, SiC, SiGeC, InAs, and InP, for example, or any physical structure suitable for a fabricating process of the invention. The substrate 10 includes a single-layer structure or a multi-layer structure. In addition, a silicon on insulator (SOI) substrate may also be used. The substrate 10 is silicon or silicon germanium, for example.

Referring to FIG. 1A again, an etch stop layer 12 is formed on the substrate 10. The etch stop layer 12 includes oxide, nitride, oxynitride, or a combination thereof. The etch stop layer 12 may be a single layer or a composite layer. The single layer is silicon nitride layer, for example. The composite layer includes at least one silicon oxide layer and at least one silicon nitride layer. A thickness of the etch stop layer 12 is 150 angstroms or more, for example. The etch stop layer 12 is formed, for example, by performing a thermal oxidation process, a chemical vapor deposition process or a combination thereof.

Referring to FIG. 1A again, a material layer 14 is formed on the etch stop layer 12. The material layer 14 has an opening T. The opening T may be an opening having an arbitrary length, width, and shape. In an embodiment, a minimum width of the opening T is 200 angstroms or more, for example. In other words, the opening T has a higher aspect ratio. In an embodiment, the aspect ratio of the opening T is 4 or more, for example. A cross section of the opening T may be in any shape, such as V shape, U shape, rhombus shape or a combination thereof, for example. However, the invention is not limited thereto.

In an embodiment, the material layer 14 is a structure formed of a single dielectric layer or multiple dielectric layers, for example. In another embodiment, the material layer 14 may also be a dielectric layer on a transistor. A material of the dielectric layer in the material layer 14 may be the same as or different from the material of the etch stop layer 12. The material of the dielectric layer in the material layer 14 may include oxide, nitride, oxynitride, or a low dielectric constant material having a dielectric constant lower than 4. A method of forming the dielectric layer in the material layer 14 includes performing a thermal oxidation process or a chemical vapor deposition process, for example.

Figure 1B:
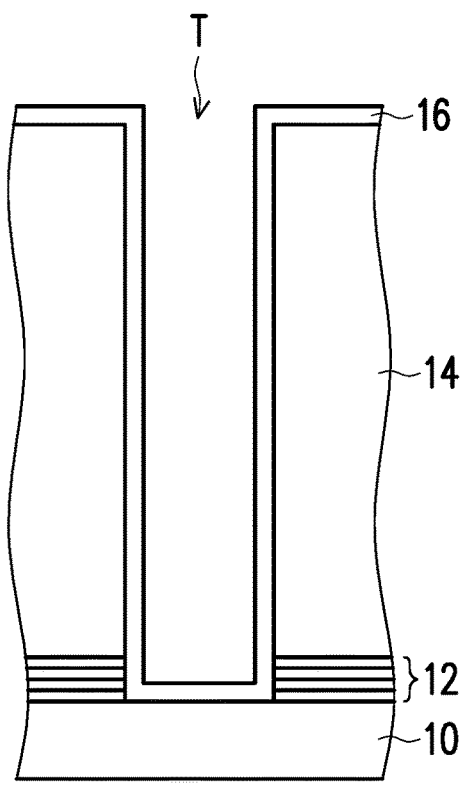

Referring to FIG. 1B, next, a first passivation material layer 16 is formed on the substrate 10 and sidewall of the opening T of the material layer 14. A material of the first passivation material layer 16 may be the same as or different from the material of the etch stop layer 12. A thickness of the first passivation material layer 16 is 50 angstroms or more, and the first passivation material layer 16 is not thicker than a half of a minimum critical dimension of the opening T, for example. In an embodiment, a method of forming the first passivation material layer 16 includes forming silicon nitride by reacting silane dihalide with an ammonia gas, for example. Silane dihalide includes difluorosilane, dichlorosilane, dibromosilane, or a combination thereof, for example.

Figure 1C:
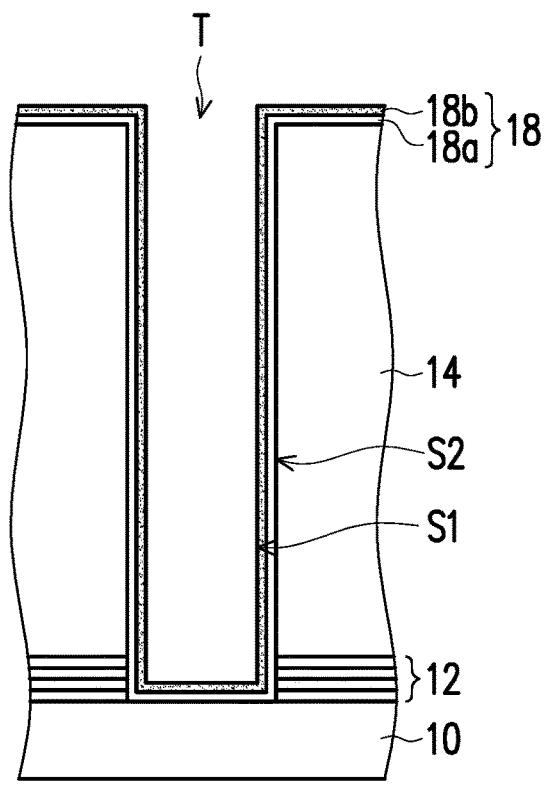

Referring to FIG. 1C, then, a treatment process is performed to the first passivation material layer 16 to form a second passivation material layer 18. It should be noted that a first surface S1 of the second passivation material layer 18 and a second surface S2 of the second passivation material layer 18 differ in a property. In an embodiment, the property includes hydrophobicity. The first surface Si is located at a side of the second passivation material layer 18 relatively away from the material layer 14. Specifically, a content of oxygen of the first surface Si of the second passivation material layer 18 is greater than a content of oxygen of the second surface S2 of the second passivation material layer 18. A material of the second surface S2 of the second passivation material layer 18 includes silicon nitride, silicon oxynitride, or a combination thereof. In an embodiment, in addition to silicon nitride, silicon oxynitride, or a combination thereof in the foregoing description, a material of the first surface Si of the second passivation material layer 18 further includes silicon-rich silicon dioxide, boron-doped silicon dioxide, phosphorus-doped silicon dioxide, silicon oxycarbide, silicon hydroxide, silicon oxycarbonitride, or a combination thereof.

The second passivation material layer 18 may be a single layer or a composite layer. In an embodiment, the second passivation material layer 18 is a composite layer and includes a first layer 18a and a second layer 18b. However, the invention is not limited thereto. The composite layer may also be a structure including more than two layers. The first layer 18a is disposed on the sidewall of the opening T of the material layer 14, and the second layer 18b is disposed on the first layer 18a. It should also be noted that a hydrophobicity of the second layer 18b is greater than a hydrophobicity of the first layer 18a. Specifically, a content of oxygen of the second layer 18b is greater than a content of oxygen of the first layer 18a. In the second passivation material layer 18, a thickness of the first layer 18a may be the same as or different from a thickness of the second layer 18b, for example. The thickness of the second layer 18b may be the same as or different from the thickness of first passivation material layer 16, for example.

The treatment process may include a hydrophobization process, for example, and the hydrophobization process may include a plasma-enhanced process, for example. A gas used in the plasma-enhanced process is oxygen or a combination of oxygen with nitrogen, hydrogen, or other gases, for example. By introducing oxygen to perform the plasma-enhanced process, generation of a condensation defect at bottom part of the opening T may be prevented, thereby improving a removing effect of the passivation material layer located at the bottom part of the opening T. A temperature of the plasma-enhanced process is in a range of −10° C. to 1000° C., for example. Specifically, the plasma-enhanced process may include performing a remote plasma process or a direct plasma process. In the remote plasma process, a pressure when the process is performed is in a range of 100 mT to 800 mT, for example, and a gas flow that is introduced is in a range of 50 sccm to 1000 sccm, for example, and a processing temperature is in a range of 50° C. to 300° C., for example. By performing the treatment process, the generation of the condensation defect at the bottom part of the opening T may be reduced or prevented, thereby improving the removing effect of the passivation material layer at the bottom part of the opening T. In the direct plasma process, a pressure when the process is performed is in a range of 50 mT to 400 mT, for example, a gas flow that is introduced is in a range of 50 sccm to 1000 sccm, for example, and a processing temperature is in a range of −10° C. to 70° C., for example. In addition to the plasma-enhanced process, the hydrophobization process may also be performed by performing a thermal oxidation process. However, the treatment process is not limited to the aforesaid processes. Any process capable of making a surface of a material hydrophobic is applicable is in the invention.

Figure 1D:
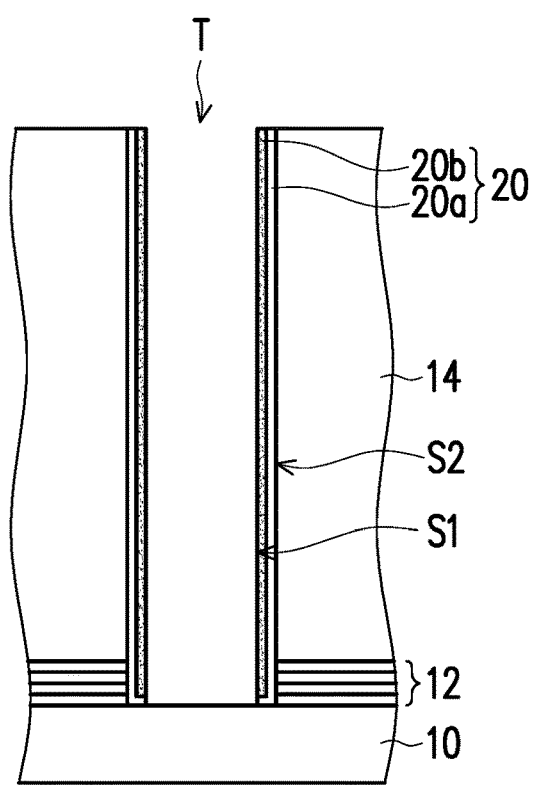

Referring to FIG. 1D, an etching process is then performed to remove the second passivation material layer 18 on the bottom part of the opening T and on a top part of the material layer 14, thereby forming passivation layer 20 on the sidewall of the opening T. The passivation layer 20 includes a first layer 20a and a second layer 20b. The first layer 20a is disposed on the sidewall of the opening T of the material layer 14, and the second layer 20b is disposed on the first layer 20a. Variation of hydrophobicity (oxygen content) in the passivation layer 20 and a material of the passivation layer 20 are the same as those of the second passivation material layer 18. A thickness of the second layer 20b may be equal to or less than a thickness of the second passivation material layer 18, for example. A method of forming the passivation layer 20 includes performing a dry etching process, for example. The dry etching process may be a sputtering etching process, a reactive ion etching process, etc. It should be noted that in this embodiment, since the passivation layer 20 does not remain at the bottom part of the opening T (i.e., the substrate 10 is exposed), a leakage current generated form the sidewall of contact of the semiconductor device fabricated accordingly is able to be effectively eliminated, thereby improving an electrical performance of the semiconductor device.

Figure 1E:
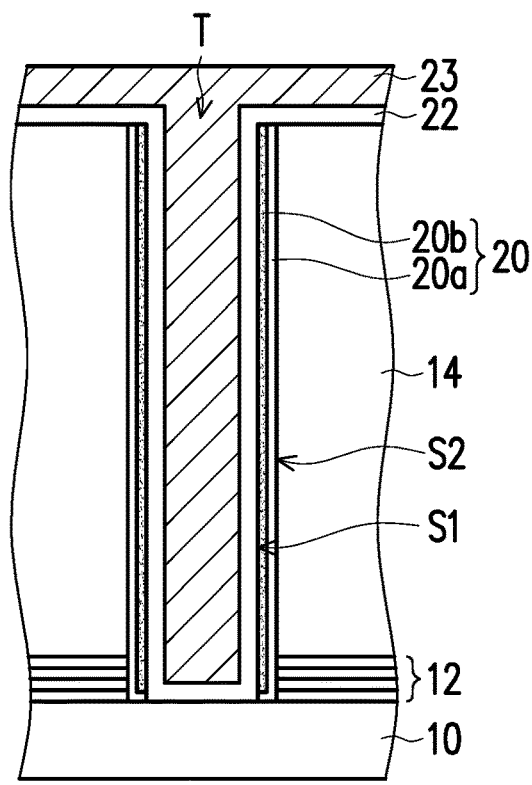

Referring to FIG. 1E, after the etching process is performed, a barrier layer 22 is formed on the passivation layer 20 and the substrate 10. A material of the barrier layer 22 is different from the material of the passivation layer 20. The material of the barrier layer 22 includes titanium, titanium nitride, tantalum, tantalum nitride, or a combination thereof, for example. A method of forming the barrier layer 22 includes performing a chemical vapor deposition process, a physical vapor deposition process, or an atomic layer deposition process, for example.

Referring to FIG. 1E again, conductor plug 23 is then formed on the barrier layer 22. The conductor plug 23 fill into the opening T. A material of the conductor plug 23 includes tungsten, copper, an aluminum copper alloy, or a combination thereof, for example. A method of forming the conductor plug 23 includes performing a chemical vapor deposition process, for example.

In the method of fabricating the semiconductor device of the invention, the first surface S1 of the second passivation material layer 18 has a higher hydrophobicity. Therefore, the condensation defect due to the second passivation material layer 18 at the bottom part of the opening T generated during the fabricating process is reduced or prevented, thereby improving the removing effect of the second passivation material layer 18. According to the method of fabricating the semiconductor device according to the invention, with the surface of the substrate 10 exposed at the bottom part of the opening T, the passivation layer 20 is formed on the sidewall of the opening T of the material layer 14, so as to prevent the leakage current form the sidewall of the contact from being generated and thus improve the electrical performance of the semiconductor device. In addition, as a critical dimension of the semiconductor structure becomes smaller, an effect of the method of fabricating the semiconductor device according to the invention becomes more significant, because it is more difficult to prevent the condensation defect when the critical dimension of the semiconductor structure is smaller. However, by using the method of fabricating the semiconductor device according to the invention, the occurrence of condensation is effectively reduced or prevented and the residue of the second passivation material layer 18 at the bottom part of the opening T is avoided to significantly improve a yield rate of the semiconductor device. Specifically, in the original process, when the critical dimension of the contact is reduced from 63 nm to 59 nm, a yield loss of the semiconductor device increases to 41.4%. However, by using the method of fabricating the semiconductor device according to the invention, the yield loss of the semiconductor device can be reduced to about 1.7%. In other words, a contact having a smaller critical dimension can be fabricated with a high yield rate by using the method of fabricating the semiconductor device according to the invention.

Even though this embodiment describes the passivation layer 20 formed by a composite layer (i.e., the first layer 20a and the second layer 20b), the method of fabricating the semiconductor device of the invention is not limited thereto. In the following, another embodiment is described to elaborate on this point. Besides, in the following description, the description about the processes and components similar to those in the above embodiment are omitted.

Figure 2A:
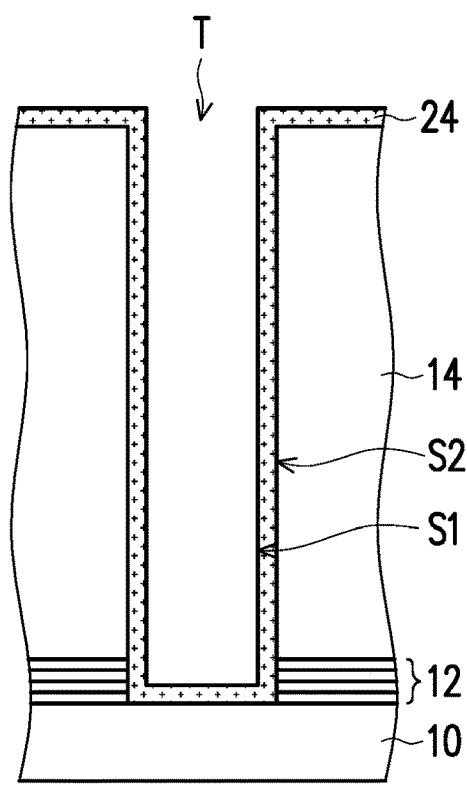
FIGS. 2A to 2C are cross-sectional schematic views illustrating a method of fabricating a semiconductor device according to another embodiment of the invention.
Figure 2B:
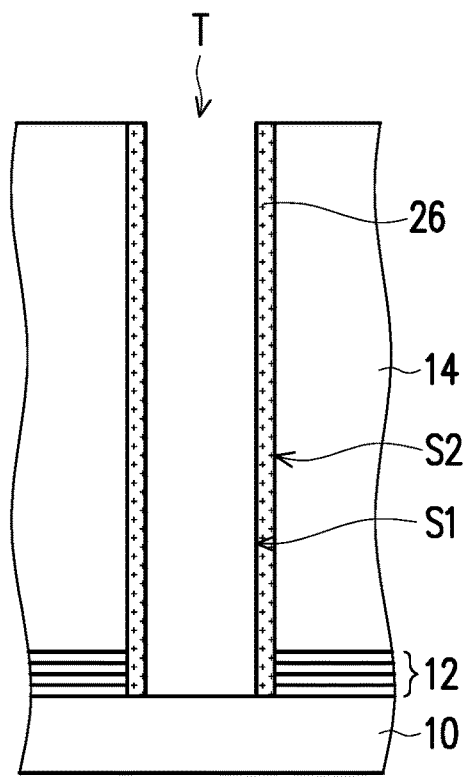
Figure 2C:
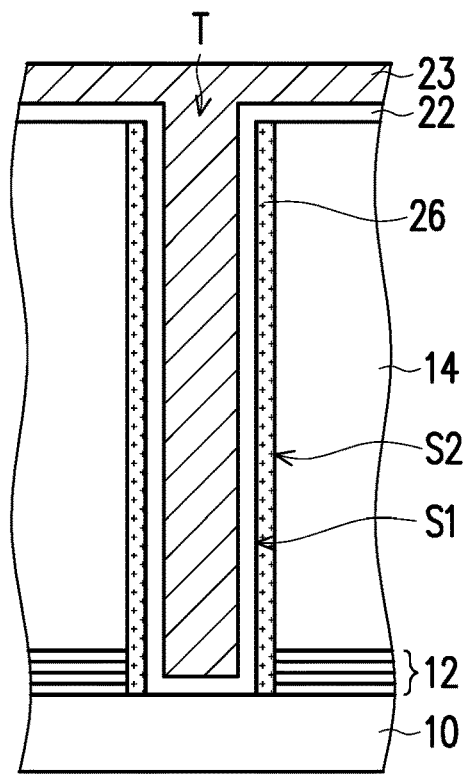

FIGS. 2A to 2C are cross-sectional schematic views illustrating a method of fabricating a semiconductor device according to another embodiment of the invention.

Referring to FIGS. 1A, 1B, and 2A, similar to the method described in the previous embodiment, in the method of fabricating the semiconductor device according to the another embodiment of the invention, the first surface S1 of a third passivation material layer 24 formed by performing a treatment process to the first passivation material layer 16 and the second surface S2 of the third passivation material layer 24 also differ in a property. In an embodiment, the property includes hydrophobicity. The first surface S1 is located at a side of the third passivation material layer 24 relatively away from the material layer 14. However, a difference from the method according to the previous embodiment is that in this embodiment, the third passivation material layer 24 does not have a composite layer structure having different hydrophobicities. Instead, in the third passivation material layer 24, a structure with a hydrophobicity that gradually increases from the sidewall of the opening T of the material layer 14 to the first surface S1 of the third passivation material layer 24 is formed. Specifically, a content of oxygen of the third passivation material layer 24 gradually increases from the sidewall of the opening T of the material layer 14 to the first surface S1 of the third passivation material layer 24. A material of the third passivation material layer 24 is the same as the material of the second passivation material layer 18 described in the foregoing, and is thus not repeated below. A thickness of the third passivation material layer 24 is the same as the thickness of the first passivation material layer 16 described in the foregoing, and is thus not repeated below. A method of forming the third passivation material layer 24 is the same as the method of forming the second passivation material layer 18 described in the foregoing, and is thus not repeated below.

Referring to FIG. 2B, an etching process is then performed to remove the third passivation material layer 24 on the bottom part of the opening T and the top part of the material layer 14 and form passivation layer 26. Variation of hydrophobicity (oxygen content) in the passivation layer 26 and a material of the passivation layer 26 are the same as those of the third passivation material layer 24. A thickness of the passivation layer 26 is equal to or less than a thickness of the third passivation material layer 24, for example. A method of forming the passivation layer 26 is the same as the method of forming the passivation layer 20 described in the foregoing, and is thus not repeated below.

Referring to FIG. 2C, after performing the etching process, the barrier 22 is formed on the passivation layer 26 and the substrate 10, and then the conductor plug 23 are formed on the barrier 22. The conductor plug 23 fill into the opening T. The materials, thicknesses, and forming methods of the barrier layer 22 and the conductor plug 23 are the same as those in the foregoing description about the barrier layer 22 and the conductor plug 23, and are thus not repeated below.

In the following, a structure of the semiconductor device according to the invention is described.

Referring to FIGS. 1E and 2C, the semiconductor device according to the invention includes the substrate 10, the etch stop layer 12, the material layer 14, the passivation layer 20, the barrier layer 22, and the conductor plug 23. The materials, thicknesses, and forming methods of the substrate 10, the material layer 14, the barrier layer 22, and the conductor plug 23 are the same as those in the foregoing description about the substrate 10, the material layer 14, the barrier layer 22, and the conductor plug 23, and are thus not repeated below.

The passivation layer 20 is disposed on the sidewall of the opening T of the material layer 14. It should be noted that the material of the passivation layer 20 is different from the material of the barrier layer 22. In addition, the first surface S1 of the passivation layer 20 and the second surface S2 (at the inner side) of the passivation layer 20 differ in a property. In an embodiment, the property includes hydrophobicity. The passivation layer 20 may be a composite layer or a single layer.

Referring to FIG. 1E, in an embodiment, the passivation layer 20 is a composite layer including the first layer 20a and the second layer 20b. The first layer 20a is disposed on the sidewall of the opening T of the material layer 14, and the second layer 20b is disposed on the first layer 20a. It should also be noted that the hydrophobicity of the second layer 20b is greater than the hydrophobicity of the first layer 20a. Specifically, the content of oxygen of the second layer 20b is greater than the content of oxygen of the first layer 20a. The ranges of the contents of oxygen of the second layer 20b and the first layer 20a are the same as the ranges of the second layer 18b and the first layer 18a in the foregoing description, and are thus not repeated below. The material, thickness, and forming method of the passivation layer 20 are the same as the material, thickness, and forming method of the passivation layer 20 in the foregoing description, and thus are not repeated below.

Referring to FIG. 2C, in another embodiment, the passivation layer 26 is a single layer, and the hydrophobicity of the passivation layer 26 gradually increases from the sidewall of the opening T to the first surface S1 of the passivation layer 26. Specifically, the content of oxygen of the passivation layer 26 gradually increases from the sidewall of the opening T to the first surface S1 of the passivation layer 26. The variation of hydrophobicity (content of oxygen), material, thickness, and forming method of the passivation layer 26 are the same as the variation of hydrophobicity (content of oxygen), material, thickness, and forming method of the passivation layer 20 in the foregoing description, and are thus not repeated below.

In view of the foregoing, in the invention, by performing the treatment process to the passivation material layer for forming the passivation layer and making the treated surface (located at the side of the passivation material layer relatively away from the material layer) of the passivation material layer and the inner side differ in a property, the passivation layer is formed on the sidewall of the opening of the material layer and residue of the passivation layer on the surface of the substrate exposed by the bottom part of the opening is prevented, thereby eliminating the leakage current generated form the sidewall of the contact and thus improving the electrical performance of the semiconductor device. Also, in the method of fabricating the semiconductor device of the invention, the treated surface of the passivation material layer has a higher hydrophobicity. Therefore, the condensation defect due to the passivation material layer at the bottom part of the opening T generated during the fabricating process is eliminated, thereby preventing the residue of the second passivation material layer at the bottom part of the opening. In addition, as the critical dimension of the semiconductor structure becomes smaller, the effect of the method of fabricating the semiconductor device according to the invention becomes more significant.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising:
   providing a substrate;
   forming a material layer on the substrate, wherein the material layer has an opening;
   forming a first passivation material layer on sidewall of the opening and the substrate, wherein the first passivation material layer is a silicon nitride (SiN) layer; and
   performing a treatment process to the first passivation material layer to form a second passivation material layer, wherein the second passivation material layer has a first surface and a second surface opposite to each other, the first surface is located at a side of the second passivation material layer relatively away from the material layer, and a content of oxygen of the first surface of the second passivation material layer is greater than a content of oxygen of the second surface of the second passivation material layer.

2. The method of fabricating the semiconductor device as claimed in claim 1, wherein the second passivation material layer is a composite layer, comprising:
   a first layer, located on a sidewall of the opening of the material layer; and
   a second layer, located on the first layer,
   wherein a thickness of the first layer is the same as a thickness of the second layer.

3. The method of fabricating the semiconductor device as claimed in claim 1, wherein the second passivation material layer is a composite layer, comprising:
   a first layer, located on a sidewall of the opening of the material layer; and
   a second layer, located on the first layer,
   wherein a thickness of the first layer is different from a thickness of the second layer.

4. The method of fabricating the semiconductor device as claimed in claim 1, wherein the second passivation material layer is a composite layer, the composite layer comprising:
   a first layer, disposed on the sidewall of the opening; and
   a second layer, disposed on the first layer,
   wherein a hydrophobicity of the second layer is greater than a hydrophobicity of the first layer.

5. The method of fabricating the semiconductor device as claimed in claim 4, wherein a content of oxygen of the second layer is greater than a content of oxygen of the first layer.

6. The method of fabricating the semiconductor device as claimed in claim 1, wherein the second passivation material layer is a single layer, and a hydrophobicity of the single layer gradually increases from the sidewall of the opening to the first surface of the second passivation material layer.

7. The method of fabricating the semiconductor device as claimed in claim 1, wherein the second passivation material layer is a single layer, and a content of oxygen of the single layer gradually increases from the sidewall of the opening to the first surface of the second passivation material layer.

8. The method of fabricating the semiconductor device as claimed in claim 1, further comprising:
   performing an etching process to remove the second passivation material layer on a bottom part of the opening and on a top part of the material layer and form a passivation layer.

9. The method of fabricating the semiconductor device as claimed in claim 8, further comprising:
   after performing the etching process, forming a barrier layer on the passivation layer and the substrate, wherein the barrier layer extends from the opening to cover a top surface of the material layer, and a material of the barrier layer comprises titanium, titanium nitride, tantalum, tantalum nitride, or a combination thereof.

10. The method of fabricating the semiconductor device as claimed in claim 1, wherein a material of the second passivation material layer comprises silicon nitride, silicon oxynitride, or a combination thereof.

11. The method of fabricating the semiconductor device as claimed in claim 10, wherein the material of the second passivation material layer further comprises silicon-rich silicon dioxide, boron-doped silicon dioxide, phosphorus-doped silicon dioxide, silicon oxycarbide, silicon hydroxide, silicon oxycarbonitride, or a combination thereof.

12. The method of fabricating the semiconductor device as claimed in claim 1, further comprising forming an etch stop layer between the substrate and the material layer, wherein the etch stop layer and the material layer have different dielectric materials.

13. The method of fabricating the semiconductor device as claimed in claim 9, wherein the barrier layer is in direct contact with the substrate.

14. The method of fabricating the semiconductor device as claimed in claim 9, further comprising forming a conductor plug on the barrier layer.

* * * * *